(12) United States Patent
Gotoh

(10) Patent No.: US 6,927,008 B2
(45) Date of Patent: Aug. 9, 2005

(54) PHOTOSENSITIVE TRANSFER MATERIAL

(75) Inventor: Hidenori Gotoh, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/705,854

(22) Filed: Nov. 13, 2003

(65) Prior Publication Data

US 2004/0106061 A1 Jun. 3, 2004

(30) Foreign Application Priority Data

Nov. 21, 2002 (JP) ........................................ 2002-337615

(51) Int. Cl.⁷ ........................ G03C 1/805; G03C 11/12; G03F 7/11
(52) U.S. Cl. ........................................ 430/263; 430/258
(58) Field of Search ................................ 430/258, 262, 430/263

(56) References Cited

U.S. PATENT DOCUMENTS

| | | | | |
|---|---|---|---|---|
| 3,884,693 A | | 5/1975 | Bauer et al. | |
| 5,292,613 A | * | 3/1994 | Sato et al. | 430/257 |
| 5,294,516 A | * | 3/1994 | Sato et al. | 430/262 |
| 5,578,413 A | * | 11/1996 | Fujikura et al. | 430/258 |
| 6,623,904 B2 | * | 9/2003 | Hatakeyama | 430/260 |
| 2003/0170558 A1 | * | 9/2003 | Hatakeyama | 430/259 |

FOREIGN PATENT DOCUMENTS

| | | |
|---|---|---|
| JP | 56-40824 | 9/1981 |
| JP | 4-12980 | 1/1992 |
| JP | 5-173320 | 7/1993 |

* cited by examiner

*Primary Examiner*—Richard L Schilling
(74) *Attorney, Agent, or Firm*—Sughrue Mion, PLLC

(57) ABSTRACT

A photosensitive transfer material including a temporary support, a thermoplastic resin layer, an intermediate layer, and a photosensitive recording layer. The thermoplastic resin layer, the intermediate layer and the photosensitive recording layer are provided in this order on the temporary support. The thermoplastic resin layer includes a thermoplastic resin and a polyester resin, and the polyester resin is contained in the thermoplastic resin layer in an amount of at least 20% by weight and no more than 90% by weight based on a total solid content of the thermoplastic resin layer.

20 Claims, No Drawings

PHOTOSENSITIVE TRANSFER MATERIAL

CROSS-REFERENCE TO RELATED APPLICATION

This application claims priority under 35USC 119 from Japanese Patent Application No. 2002-337615, the disclosure of which is incorporated by reference herein.

BACKGROUND OF THE INVENTION

1. Field of the Invention

The present invention relates to a photosensitive transfer material suitable for dry transfer onto a substrate having unevenness and to an image forming method using the same. A photosensitive transfer material and an image forming method according to the invention are preferably used in production of a color filter employed in a liquid crystal display or the like and in production of a printed circuit board.

2. Description of the Related Art

A photosensitive transfer material for transferring a photosensitive resin layer onto a substrate is well-known (for example, see Japanese Patent Application Publication (JP-B) No. 56-40824). Such a photosensitive transfer material is used in production of printed circuits, intaglio printing/relief printing plates, name plates, multicolor trial printing samples, offset printing plates, screen printing stencils and the like. The transfer material is constructed of at least a temporary support, an intermediate layer and a photopolymerizable layer. A substrate is adhered to the transfer material at the photopolymerizable layer, and then only the temporary support is peeled off. Thereafter, light is exposed through a separation layer, followed by developing, to form an image on the substrate. The separation layer plays a role of oxygen blocking, and it is advantageous with respect to exposure to light in the air. A thickness of the separation layer is very thin, having a value of the order from 0.5 μm to 5 μm; therefore, no problems occur from the point of view of resolving power, either.

For example, Japanese Patent Application Laid-Open (JP-A) No. 5-173320 discloses a photosensitive transfer material, in which an alkali-soluble thermoplastic resin layer, an intermediate layer and a photosensitive resin layer are provided in this order on a temporary support. However, in the above-mentioned photosensitive transfer material, it is impossible to transfer only the intermediate layer and the photosensitive resin layer, and the thermoplastic resin layer is also transferred simultaneously, inevitably causing developing solution to be wastefully consumed.

Moreover, for example, Japanese Patent Application Laid-Open (JP-A) No. 4-12980 discloses a method of transferring a photosensitive resin layer, the method employing a photosensitive transfer material constructed of a thermoplastic resin layer, a separation layer and a photosensitive resin layer provided in this order on a temporary support, particularly a plastic film having a gelatin undercoat thereon. The photosensitive resin layer is adhered onto a support, and thereafter the temporary support and the thermoplastic resin layer are simultaneously peeled-off and removed to thus transfer the photosensitive resin layer onto the support. In this method, it is not always easy to control peelability between the thermoplastic resin layer and the separation layer. Moreover, the method is not sufficient to satisfy requirements for automation of a peeling operation.

SUMMARY OF THE INVENTION

It is a first object of the present invention to provide a photosensitive transfer material, in transfer of a photosensitive resin layer thereof from a temporary support to a permanent support, free from a transfer defect (generation of bubbles) caused by scratches on the permanent support and surface level differences thereon originating from pixels that have been already formed thereon, and capable of high speed transfer, of satisfactorily sufficient separation from the temporary support, of exposure to light in the air, and of removal of an alkali-soluble thermoplastic resin layer with an alkaline aqueous solution in a short time; and an image forming method using the material.

It is a second object of the invention to reduce kinds of developing solution and an amount thereof used in development as compared with a case where only a temporary support is peeled off by facilitating separation of an intermediate layer from a thermoplastic resin layer.

The objects of the invention are achieved by the following photosensitive transfer materials.

A first aspect of the invention is to provide a photosensitive transfer material including a temporary support, a thermoplastic resin layer, an intermediate layer, and a photosensitive recording layer. The thermoplastic resin layer, the intermediate layer and the photosensitive recording layer are provided in this order on the temporary support. The thermoplastic resin layer includes a thermoplastic resin and a polyester resin, and the polyester resin is contained in the thermoplastic resin layer in an amount of at least 20% by weight and no more than 90% by weight based on a total solid content of the thermoplastic resin layer.

A second aspect of the invention is to provide a photosensitive transfer material according to the first aspect, wherein a number average molecular weight of the polyester resin is at least 800 and no more than 50000.

DETAILED DESCRIPTION OF THE INVENTION

A photosensitive transfer material of the present invention is constructed of at least a thermoplastic resin layer, an intermediate layer and a photosensitive recording layer provided in this order on a temporary support. The thermoplastic resin layer includes a thermoplastic resin and a polyester resin, and the polyester resin is contained in the thermoplastic resin layer in an amount of at least 20% by weight and no more than 90% by weight based on a total solid content of the thermoplastic resin layer. The photosensitive transfer material may further include another layer if necessary.

<Thermoplastic Resin Layer>

A thermoplastic resin layer of the present invention includes a thermoplastic resin and a polyester resin. The polyester resin is contained in the thermoplastic resin layer in an amount of at least 20% by weight and no more than 90% by weight based on a total solid content of the thermoplastic resin layer. A number average molecular weight of the polyester resin is preferably at least 800 and no more than 50000. Other additives such as a binder can be added if necessary, and the binder is preferably alkali-soluble.

(Polyester Resin)

The above-described polyester resin of the invention is a polymer compound, having an ester bond in a molecule, and obtained by condensation polymerization of mainly a dicarboxylic acid or a derivative thereof such as an ester and a polyvalent alcohol.

While the polyester resin of the invention can be either non-crystalline or crystalline, the resin is preferably crystalline as far as the resin is soluble in an organic solvent. While the polyester resin can be either soluble or insoluble in an organic solvent, the resin is preferably soluble in an organic solvent.

Examples of the dicarboxylic acid or the derivative thereof such as an ester include aromatic dicarboxylic acids such as isophthalic acid, terephthalic acid, naphthalenedicarboxylic acid, phthalic acid, diphenylketonedicarboxylic acid, anthracenedicarboxylic acid, and diphenyldicarboxylic acid; aliphatic dicarboxylic acids such as adipic acid, sebacic acid, azelaic acid, suberic acid, pimelic acid, glutaric acid, succinic acid, cyclohexanedicarboxylic acid, and cyclobutanedicarboxylic acid; and derivatives thereof such as esters; among which the aromatic dicarboxylic acids and the aliphatic dicarboxylic acids are preferable and, to be concrete, isophthalic acid, terephthalic acid, adipic acid and sebacic acid are preferable. Further examples thereof include dicarboxylic acids having an element other than carbon, hydrogen and oxygen, including, to be concrete, 5-sodium sulfoisophthalic acid, 5-methylsulfoisophthalic acid and the like. Polyfunctional compounds such as trimellitic acid, pyromellitic acid and the like are allowed to be additionally used if the usage is limited to a small amount. Examples of the derivative thereof such as esters include an ester, an acid anhydride, an acid amide and the like.

A polyvalent alcohol is preferably a divalent or trivalent alcohol and preferable examples of divalent alcohols include ethylene glycol, propylene glycol, butylene glycol, diethylene glycol, triethylene glycol, trimethylene glycol, tetramethylene glycol, pentamethylene glycol, hexamethylene glycol, polyethylene glycol, butane diol, thioglycol, neopentyl glycol, cyclohexanedimethanol, propane diol, an ethylene oxide adduct of bisphenol A, a propylene oxide adduct of bisphenol A, an ethylene oxide adduct of hydrogenated bisphenol A, and a propylene oxide of hydrogenated bisphenol A, and ethylene glycol and propylene glycol are particularly preferable.

Preferable examples of trivalent alcohols include glycerin, trimethylolethane, trimethylolpropane, among which glycerin is particularly preferable. Examples of oxycarboxylic acids used in production of polyester include p-oxyethoxybenzoic acid, vanilic acid, p-oxyethoxy-m-chlorobenzoic acid, p-oxymethylbenzoic acid, glycolic acid and the like. Note that while the above-described polyester resin can be synthesized according to a common synthetic method, a commercially available product of the kind may be used.

A content of the above-described polyester resin is preferably at least 20% by weight and no more than 90% by weight, more preferably at least 20% by weight and no more than 80% by weight, and most preferably at least 25% by weight and no more than 70% by weight based on a total solid content of the thermoplastic resin layer. If the content is less than 20%, a peeling-off occurs not between the intermediate layer and the thermoplastic resin layer, but between the intermediate layer and the temporary support. On the other hand, if the content exceeds 90%, a material deriving from the thermoplastic resin layer is not dissolved or, even if being dissolved, becomes extremely unstable to be precipitated as a resin component during the development.

A number average molecular weight of a polyester resin is preferably in the range of 800 to 50000, more preferably in the range of 1500 to 35000, and most preferably in the range of 1800 to 17000. If the number average molecular weight is less than 800, resolving power is reduced and a degree of reticulation is degraded, while if the number average molecular weight is more than 50000, transferability and dissolving property in developing solution are lowered.

(Thermoplastic Resin)

A thermoplastic resin layer of the invention include at least a thermoplastic resin as a resin component. A resin retaining a film strength (hereinafter also referred to as a "resin (A)") and a resin imparting a melting property when heated (hereinafter also referred to as a "resin (B)") are preferably used in combination as a thermoplastic resin used together with the polyester resin included in the thermoplastic resin layer. Examples of the resin (A) include a saponified product of ethylene/acrylic acid ester copolymer, a saponified product of styrene/(meth)acrylic acid ester copolymer, styrene/(meth)acrylic acid/(meth)acrylic acid ester terpolymer, a saponified product of vinyltoluene/(meth) acrylic acid ester copolymer, poly(meth)acrylic acid ester, a saponified product of a (meth)acrylic acid ester copolymer such as butyl (meth)acrylate and vinyl acetate; and at least one organic polymer having a weight average molecular weight preferably in the range of 50000 to 500000 (Tg=0 to 140° C.) and more preferably in the range of 60000 to 200000 (Tg=30 to 110° C.), selected from the group consisting of organic polymers soluble in an alkaline aqueous solution, described in Japan Plastic Industrial Association and All Japan Plastic Molding Industrial Association (coed.), "Plastic Performance Handbook," published by Industrial Investigation Association on Oct. 25, 1968.

Concrete examples of resins (A) described above include resins soluble in an alkaline aqueous solution that are described in the following specifications of JP-B Nos. 54-34327, 55-38961, 58-12577, 54-25957, JP-A No. 61-134756, JP-B No. 59-44615, JP-A Nos. 54-92723, 54-99418, 54-137085, 57-20732, 58-93046, 59-97135 and 60-159743, OLS No. 3504254, JP-A Nos. 60-247638, 60-208748, 60-214354, 60-230135, 60-258539, 61-169829, 61-213213, 63-147159, 63-213837, 63-266448, 64-55551, 64-55550, 2-191955, 2-199403, 2-199404, 2-208602 and 5-241340. A particularly preferable example is a copolymer of methacrylic acid, 2-ethylhexy-lacrylate, benzylmethacrylate, and methylmethacrylate described in JP-A No. 63-147159.

The above-described resin (B) can be one having a weight average molecular weight preferably in the range of 3000 to 30000 (Tg=30 to 170° C.) and more preferably in the range of 4000 to 20000 (Tg=60 to 140° C.) selected from the above described various kinds of resins. While preferable examples thereof can be selected from resins described in the specifications, a particularly preferable example is a copolymer of styrene and (meth)acrylic acid that is described in JP-B No. 55-38961 and JP-A No. 5-241340.

If a weight average molecular weight of a resin (A) included in a thermoplastic resin layer is less than 50000 or Tg is lower than 0° C., reticulation may occur and a thermoplastic resin may greatly contaminate the permanent support by being melted and flowed outside. On the other hand, if the weight average molecular weight exceeds 50000 or Tg is higher than 140° C., bubbles intrude into between pixels during the transfer in one case and a removability of the thermoplastic resin by an alkaline aqueous solution is reduced in another case.

If a weight average molecular weight of the above-described resin (B) included in a thermoplastic resin layer is less than 3000 or Tg is lower than 30° C., reticulation may occur and a thermoplastic resin may greatly contaminate the permanent support by being melted and flowed outside. On the other hand, if the weight average molecular weight exceeds 30000 or Tg is higher than 170° C., bubbles may be trapped between pixels during the transfer and it may become difficult to remove the thermoplastic resin by an alkaline aqueous solution.

With respect to the mixing ratio of resin (A) and resin (B), if the proportion of resin (A) exceeds 95%, bubbles may be easily trapped between pixels during the transfer, while if the proportion of resin (A) is less than 5%, a thermoplastic resin may be melted to flow outside or the thermoplastic resin may become brittle, resulting in scattering of fine chips in a sawing process.

While resins (A) and (B) described above work as the above-described binder and have a binding function as a binding agent, it is preferable to additionally use another alkali-soluble binder together with the resins (A) and (B). Examples of binders preferably used additionally together with the resins (A) and (B) include homopolymers and copolymers having, as a constituent, at least acrylic acid, methacrylic acid, itaconic acid, fumaric acid, crotonic acid or styrenesulfonic acid, and particularly preferable examples include a homopolymer and a copolymer having, as a constituent, acrylic acid or methacrylic acid.

A content of the above-described binder is preferably in the range of 10 to 80% by weight, more preferably in the range of 20 to 80% by weight and most preferably in the range of 30 to 75% by weight based on a total solid content of a thermoplastic resin layer. These binders may be used either in a single kind or simultaneously in two or more kinds.

In order to adjust an adhesion force of a thermoplastic resin layer with a temporary support and/or transferability thereof, various additives may be added thereinto together with the resins described above, which include plasticisers such as various kinds of polymers, a supercooling material, an adhesion improving agent, a surfactant and a releasing agent and the like, thereby enabling fine adjustment of Tg of the thermoplastic resin layer.

Preferable examples of plasticizers include polypropylene glycol, polyethylene glycol, dioctylphthalate, diheptylphthalate, dibutylphthalate, tricresyl phosphate, cresyldiphenyl phosphate, biphenyldiphenyl phosphate, polyethylene glycol mono(meth)acrylate, polyethylene glycol di(meth)acrylate, polypropylene glycol mono(meth)acrylate, polypropylene glycol di(meth)acrylate, an addition reaction product of epoxy resin and polyethylene glycol mono(meth)acrylate, an addition reaction product of organic diisocyanate and polyethylene glycol mono(meth)acrylate, an addition reaction product of organic diisocyanate and polypropylene glycol mono(meth)acrylate, a condensation reaction product of bisphenol A and polyethylene glycol mono(meth)acrylate and the like.

An amount of the above-described plasticizer to be used is preferably in the range of 0 to 200% by mass and more preferably in the range of 20 to 100% by mass based on a total amount (mass) of resins A and B constituting a thermoplastic resin layer.

A thickness of a thermoplastic resin layer is preferably at least about 6 μm. This is because if a thickness of a thermoplastic resin layer is less than 6 μm, it is impossible to perfectly absorb depressions and projections of 1 μm or more on a substrate. The upper limit of a thickness of a thermoplastic resin layer is preferably about 100 μm or less and more preferably about 50 μm or less from the viewpoint of removability by an alkaline aqueous solution and manufacture adaptability.

In the preparation of a coating solution for forming a thermoplastic resin layer, a solvent is generally used and any solvent can be used without specific limitation as far as it dissolves a resin included in this layer. Examples thereof include methyl ethyl ketone, methanol, propylene glycol monomethyl ether, n-propanol, i-propanol and the like.

<Intermediate Layer>

Any intermediate layer may be used as far as the layer is made of a material that can be dispersed or dissolved in water or an alkaline aqueous solution and shows low oxygen permeability. The material that constitutes the layer can be a known material. Examples thereof are described in JP-A No. 46-2121 and JP-B No. 56-40824, including polyvinyl ether/maleic anhydride polymer, a water-soluble salt of carboxyalkyl cellulose, water-soluble cellulose ethers, a water-soluble salt of carboxyalkyl starch, polyvinyl alcohol, polyvinyl pyrrolidone, various kinds of polyacrylamides, various kinds of water-soluble polyamides, a water-soluble salt of polyacrylic acid, gelatin, ethylene oxide polymer, a water-soluble salt of a group including various kinds of starches and analogous products thereof, a copolymer of styrene/maleic acid and a maleate resin; and a combination thereof in two or more kinds. Among them, a particularly preferable example is a combination of polyvinyl alcohol and a polyvinyl pyrrolidone. A saponification degree of polyvinyl alcohol is preferably 80% or more, and a content of polyvinyl pyrrolidone is preferably in the range of 1% by mass to 75% by mass, more preferably in the range of 1% by mass to 60% by mass and most preferably in the range of 10% by mass to 50% by mass relative to a solid content of the intermediate layer. If the content is 1 or more % by mass, an adhesion property to a photosensitive resin layer is sufficiently ensured, while if the content is less than 75% by mass, oxygen blocking property is hard to be reduced. A thickness of an intermediate layer is very thin so as to fall preferably in the range of about 0.1 to about 5 μm and particularly in the range of about 0.5 to about 2 μm. If the thickness is about 0.1 μm or more, oxygen permeability can be suppressed, while if the thickness is less than about 5 μm, time required in development or in removal of an intermediate layer can be short.

<Photosensitive Resin Layer>

A photosensitive resin layer preferably becomes at least soft or adhesive at a temperature of 150° C. or lower and preferably thermoplastic. While most of layers in which known photopolymerizable compositions are used have such properties, part of known layers can be further modified in property by addition of a thermoplastic binding agent or a compatible plasticizer. Known photosensitive resins, for example all of photosensitive resins described in JP-A No. 3-282404, can be used as materials of a photosensitive resin layer of the invention. Examples thereof include a photosensitive resin layer constituted of a negative type diazo resin and a binder, a photopolymerizable composition, a photosensitive resin composition constituted of an azide compound and a binder, a cinnamic acid type photosensitive resin composition and the like. Among them, a particularly preferable example is a photopolymerizable resin. The photopolymerizable resin includes a photopolymerization initiator, a photopolymeirzable monomer and a binder as basic constituents. While two kinds of photosensitive resins have been known, one of which is developable with an alkaline aqueous solution, and the other of which is developable with an organic solvent, a photosensitive resin that can be developable with an alkaline aqueous solution is preferable from the viewpoint of pollution control and labor safety.

A dye or a pigment can be further added into a photosensitive resin. All of a pigment is homogeneously dispersed in a photosensitive resin layer and particle diameters of the pigment have to be preferably 5 μm or less and particularly preferably 1 μm or less. In production of a color filter, particle diameters of a pigment are preferably 0.5 μm or less.

Preferable examples of dyes or pigments include Victoria Pure Blue BO (C. I. 42595), Auramine (C. I. 41000), Fat Black HB (C. I. 26150), Monolite Yellow GT (C. I. Pigment Yellow 12), Permanent Yellow GR (C. I. Pigment Yellow 17), Permanent Yellow HR (C. I. Pigment Yellow 83), C. I. Pigment Yellow 138, Permanent Carmine FBB (C. I. Pigment Red 146), Hosterberm Red ESB (C. I. Pigment Violet 19), Permanent Ruby FBH (C. I. Pigment Red 11), Faster Pink B Supra (C. I. Pigment Red 81), Monastral Fast Blue (C. I. Pigment Blue 15), Monolite Fast Black B (C. I. Pigment Black 1) and carbon. Further examples of pigments suitable for forming a color filter include C. I. Pigment Red 97, C. I. Pigment Red 122, C. I. Pigment Red 149, C. I. Pigment Red 168, C. I. Pigment Red 177, C. I. Pigment Red 180, C. I. Pigment Red 192, C. I. Pigment Red 215, C. I. Pigment Green 7, C. I. Pigment Green 36, C. I. Pigment Blue 15:1, C. I. Pigment Blue 15:4, C. I. Pigment Blue 15:6, C. I. Pigment Blue 22, C. I. Pigment Blue 66 and C. I. Pigment Blue 64.

In order to protect a photosensitive resin layer from contamination and damages during storage, it is preferable to provide a thin cover sheet on the photosensitive resin layer. While the cover sheet may be made of the same material as a temporary support or a material analogous to that of the temporary support, the cover sheet has to be separable from the photosensitive resin layer with ease. Proper examples of materials of cover sheets include silicone paper, a polyolefin or polytetrafluoroethylene sheet. A thickness of a cover sheet is preferably in the range of about 5 to 100 $\mu$m. Particularly preferable examples thereof are polyethylene and polypropylene films each having a thickness in the range of 10 to 30 $\mu$m.

<Temporary Support>

A temporary support of a photosensitive transfer material of the invention should be made of a material having a sufficiently good peelability from a thermoplastic resin layer, being stable chemically and thermally, and being flexible. Preferable examples thereof include thin sheets made of Teflon (R), polyethyleneterephthalate, polycarbonate, polyethylene, polypropylene and the like, and laminates thereof, which have preferably low charging property. A thickness of a temporary support is preferably in the range of 5 $\mu$m to 300 $\mu$m and particularly preferably in the range of 20 $\mu$m to 150 $\mu$m.

A part of a thermoplastic resin may be melted to flow outside during the transfer step depending on a transfer condition of a photosensitive transfer material so as to contaminate a permanent support. In order to eliminate the adverse influence of the contamination, it is preferable to adopt a thermoplastic resin that is soluble in an alkaline aqueous solution. This is because a thermoplastic resin soluble in an alkaline aqueous solution can be removed with ease in a subsequent treatment. An alkaline aqueous solution may be either the same as or different from an alkaline aqueous solution for a photosensitive resin of the invention. While an alkaline aqueous solution of the invention is a dilute aqueous solution of an alkaline material, the solution also includes, an alkaline aqueous solution added with a small amount of an organic solvent miscible with water. Proper examples of alkaline materials include alkali metal hydroxides (for example, sodium hydroxide and potassium hydroxide), alkali metal carbonates (for example, sodium carbonate and potassium carbonate), alkali metal bicarbonates (sodium bicarbonate and potassium bicarbonate), alkali metal silicates (sodium silicate and potassium silicate), alkali metal metasilicates (sodium metasilicate and potassium metasilicate), triethanolamine, diethanolamine, monoethanolamine, morphorine, tetralkylammonium hydroxides (for example tetramethylammonium hydroxide) and trisodium phophate. A concentration of an alkaline material is preferably in the range of 0.01% by mass to 30% by mass and a pH value is preferably in the range of 8 to 14.

Proper examples of organic solvent miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, $\epsilon$-caprolactone, $\gamma$-butylolactone, dimethylformamide, dimethylacetamide, hexamethylphosphoramide, ethyl lactate, methyl lactate, $\epsilon$-caprolactam and N-methylpyrrolidone. A concentration of an organic solvent miscible with water is preferably in the range of 0.1% by mass to 30% by mass. A known surfactant can be further added. A concentration of a surfactant is preferably in the range of 0.01% by mass to 10% by mass.

(Conductivity)

Electrification occurs between a film and a human body when a temporary support is peeled off after a photosensitive resin layer of a photosensitive transfer material is adhered onto a permanent support, and an operator may receive an unpleasant electrical shock. Moreover, dusts are attracted by the electrification onto the permanent support to produce an unexposed portion on the photosensitive resin layer in a succeeding exposure process, and this may generate a pin hole. In order to prevent the generation of the pin hole and the electrostatic shock, it is preferable to impart electric conductivity to the temporary support to reduce surface electric resistance to $10^{13}\Omega$ or less. Alternatively, it is preferable to provide a conductive layer on at least one surface of the temporary support so as to reduce a surface electric resistance of the at least one surface to $10^{13}\Omega$ or less.

In order to impart an electric conductivity to a temporary support, it is preferable to incorporate a conductive material into the temporary support. Examples of conductive materials include fine particles of a metal oxide, an antistatic agent and the like, and, a method in which one kind or two or more kinds selected from the conductive materials are kneaded into the temporary support is preferably employed. The metal oxide as a conductive material is fine particles in a crystalline state of at least one kind of a metal oxide selected from the group consisting of zinc oxide, titanium oxide, tin oxide, aluminum oxide, indium oxide, silicon oxide, magnesium oxide, barium oxide and molybdenum oxide; and/or fine particles in a crystalline state of a complex oxide constituted of two or more kinds selected from the same group. Useful examples of antistatic agents include alkyl phosphate-based agents as an anionic surfactant, (for example, Electrostripper A manufactured by Kao Corp., Elenon No. 19 manufactured by Dai-ichi Kogyo Seiyaku Co., Ltd. and the like); betaine-based agents as an ampholytic surfactant (for example, Amogen K manufactured by Dai-ichi Kogyo Seiyaku Co., Ltd. and the like); polyoxyethylene fatty acid ester-based agents as a nonionic surfactant (for example, Nissan Nonion L manufactured by Nippon Oil and Fat Co., Ltd. and the like), and polyoxyethylene alkyl ether-based agents as a nonionic surfactant (for example, Emulgen 106, 120, 147, 420, 220, 905 and 910 manufactured by Kao Corp, Nissan Nonion E manufactured by Nippon Oil and Fat Co., Ltd. and the like). Other examples thereof further include polyoxyethylenealkylphenol ether-based agents, polyvalent alcohol fatty acid ester-based agents, polyoxyethylenesorbitan fatty acid ester-based agents, polyoxyethylenealkylamine-based agents and the like as a nonionic surfactant.

When a conductive layer is provided on a support, a conductive material of the conductive layer can be selected from known conductive materials. A preferable method is particularly to incorporate, as a conductive material, fine particles of a crystalline metal oxide selected from the group consisting of ZnO, $TiO_2$, $SnO_2$, $Al_2O_3$, $In_2O_3$, $SiO_2$, MgO, BaO and $MoO_3$ and/or complex oxide thereof. This method is preferable since the conductive layer shows conductivity independent of temperature. Fine particles of the crystalline metal oxide or the complex oxide have a volume resistance of preferably $10^7 \Omega \cdot cm$ or less and particularly preferably $10^5 \Omega \cdot cm$ or less. The particle size is preferably in the range of 0.01 to 0.7 µm and particularly preferably in the range of 0.02 to 0.5 µm.

JP-A No 56-143430 provides detailed description of producing methods of fine particles of a conductive, crystalline metal oxide and a complex oxide. The outline is as follows: in a first method, metal oxide fine particles are prepared by calcination, followed by a heat treatment in the presence of a hetero atom that improves conductivity; in a second method, a hetero atom that improves conductivity co-exists together with a target oxide or a target complex oxide in production of metal oxide fine particles of the target oxide by calcination; and in a third method, an oxygen concentration in the atmosphere is reduced in production of metal oxide fine particles by calcination to thereby introduce oxygen defects into the metal oxide. Examples of the metal oxides having a hetero atom therein include ZnO having Al, In or the like; $TiO_2$ having Nb, Ta or the like; $SnO_2$ having Sb, Nb, a halogen element or the like. An amount of a hetero atom to be added is preferably in the range of 0.01 to 30 mol % and particularly preferably in the range of 0.1 to 10 mol %. An amount of conductive particles is preferably in the range of 0.05 g/m² to 20 g/m² and particularly preferably in the range of 0.1 g/m² to 10 g/m².

Examples of binders that can be used in a conductive layer of the invention include gelatin; cellulose esters such as cellulose nitrate, cellulose triacetate, cellulose diacetate, cellulose acetate butylate, cellulose acetate propionate; homopolymers or copolymers including vinylidene chloride, vinyl chloride, styrene, acrylonitrile, vinyl acetate, an alkyl group (alkyl groups having C1 to C4), acrylate, vinyl pyrrolidone and the like; soluble polyester; polycarbonate; soluble polyamide; and others. A dispersing liquid such as a titanium-based dispersant or a silane-based dispersant may be added into the above-described binder in dispersing of conductive particles. A binder cross-linking agent or the like can be non-problematically added into the conductive layer. Examples of titanium-based dispersants include a titanate-based coupling agent and Prenact (a trade name manufactured by Ajinomoto Co., Ltd.) which are described in U.S. Pat. Nos. 4,069,192, 4,080,353, and the like. Examples of known silane-based dispersants include vinyl trichlorosilane, vinyl triethoxy silane, vinyl tris(β-methoxyethoxy) silane, γ-glycidoxypropyl trimethoxy silane, γ-methacryloxypropyl methoxy silane and the like, which are sold as silane coupling agents in the market from Shin-Etsu Chemical Co., Ltd. Examples of binder cross-linking agents include an epoxy-based cross-linking agent, an isocyanate-based cross-linking agent, an aziridine-based cross-linking agent and an epoxy-based cross-linking agent and the like. A preferable conductive layer of the invention can be provided by dispersing conductive particles in a binder to form the conductive layer on a temporary substrate, or alternatively, by applying an undercoat treatment on a temporary substrate to attach conductive particles thereon.

When a conductive layer is provided on a temporary support opposite to the surface on which a photosensitive resin layer is disposed, it is preferable to further provide a hydrophobic polymer layer on a conductive layer in order to improve scratch resistance. The hydrophobic polymer layer may be formed by coating the solution of the hydrophobic polymer in an organic solvent or the aqueous latex of the hydrophobic polymer. A coating amount is preferably in the range of 0.05 g/m² to 1 g/m² in a dry state. Examples of hydrophobic polymers include cellulose ester (for example, nitrocellulose, cellulose acetate), vinyl-based polymers including vinyl chloride, vinylidene chloride, vinyl acrylate and the like, polymers such as an organic solvent-soluble polyamide, polyester. A sliding agent that imparts sliding property can be used in this layer, and examples thereof include an organic carboxylic acid amide or the like as described in JP-A No. 55-79435. A matting agent or the like may also be used without any problems. Even with such a hydrophobic polymer layer provided, no substantial influence is exerted on the effect of a conductive layer of the invention.

In order to improve sliding property, or in order to prevent inconvenient adhesion of a photosensitive resin layer to a rear surface of a temporary support, it is also useful to coat a composition that imparts sliding property. The composition may include known fine particles or a releasing agent including a silicone compound on the rear surface of the temporary support.

It is a preferable embodiment that a conductive material is incorporated in a plastic raw material that is the same as, or different from a temporary support film and the conductive layer is extruded together with a temporary support film when the temporary support film is extruded. In this method it is possible to easily obtain a conductive layer excellent in adhesion property and scratch resistance. Thus, no necessity arises for a hydrophobic polymer layer and an undercoat layer. In the coating of a conductive layer, various kinds of common methods can be adopted, including a roller coating method, an air knife coating method, a gravure coating method, a wire bar coating method, a curtain coating method and the like.

When a conductive layer is provided on a temporary support on the side on which thermoplastic resin layer is not provided, various kinds of treatments described below can be applied on a temporary support in order to enhance a adhesion force between the thermoplastic resin layer and the support. Examples of treatments include surface treatments such as a glow discharge treatment, a corona discharge treatment, an ultraviolet ray irradiation treatment; undercoat treatments with a phenolic material, polyvinyliene chloride, styrenebutadiene rubber, gelatin and the like; and a combination thereof. In a case where a thermoplastic resin is alkali-soluble, a polyethyleneterephthalate film on which gelatin has been undercoated after a corona discharge treatment is preferable since the film imparts particularly excellent adhesion to the conductive layer. In that case, a thickness of a gelatin layer is preferably in the range of 0.01 µm to 2 µm.

In the invention, conductive layers described in the following publications can be properly used: JP-A Nos. 56-82504, 56-143443, 57-104931, 57-118242, 58-62647, 60-258541 and others.

In a case where the undercoat layer described above is provided, the following polymers can be used: vinylidene chloride-based copolymers as described in JP-A No. 51-135526, U.S. Pat. Nos. 3,143,421, 3,586,508, 2,698,235, 3,567,452 and others; diolefin-based copolymers such as butadiene as described in JP-A No. 51-114120, U.S. Pat. No. 3,615,556 and others; glycidyl acrylate or glycidyl methacrylate containing copolymers as described in JP-A No. 51-58469 and others; polyamide/epichlorohydrin resin as described in JP-A No. 48-24923 and others; and maleic anhydride containing copolymers and the like as described in JP-A No. 50-39536.

In order to prevent electrostatic shock caused by electrification when a photosensitive transfer material of the invention is used, a surface electric resistance of a conductive layer or a temporary support to which conductivity is imparted is necessarily $10^{13}\Omega$ or less, and preferably $10^{12}\Omega$ or less.

<Producing Method of Photosensitive Transfer Material>

A photosensitive transfer material of the invention can be produced in a procedure as follows. A thermoplastic resin layer solution is applied on a temporary support to form a thermoplastic resin layer by drying. An intermediate layer is formed on the thermoplastic resin layer by applying a solution of the intermediate layer material in a solvent that does not dissolve the thermoplastic resin layer and by drying the same. A photosensitive resin layer is formed on the intermediate layer by applying a solution of the photosensitive resin layer material in a solvent that does not dissolve the intermediate layer and drying the same. If necessary, a cover sheet is further adhered onto the photosensitive resin layer by pressing. Other procedures can also be adopted. For instance, a cover sheet having a photosensitive resin layer thereon and a temporary support having a thermoplastic resin layer and an intermediate layer are prepared separately. These are adhered onto each other so that the intermediate layer and the photosensitive resin layer contact with each other. As another example, a temporary support having a thermoplastic resin layer is prepared as a cover sheet, and another cover sheet having a photosensitive resin layer and an intermediate layer is prepared. Then, these are adhered onto each other so that the thermoplastic resin layer and the intermediate layer contact with each other.

<Image Forming Method>

An image forming method using a photosensitive transfer material of the invention will be explained as follows. At first, a cover sheet on a photosensitive transfer material is removed, and then a photosensitive resin layer is adhered onto a substrate under pressure and heating. A laminator or a vacuum laminator, which have been conventionally known, can be used in an adhering process and in order to further raise productivity, an auto-cut laminator can be adopted. Then, after the temporary support is peeled off, exposure is conducted through a predetermined mask, a thermoplastic resin layer and an intermediate layer, followed by removal of unnecessary layers. The removal is performed by any known method. For example, exposed layers are immersed in a solvent or an aqueous developing solution, particularly an alkaline aqueous solution. Alternatively, a treatment solution is applied on exposed layers from a sprayer. These methods may be combined with rubbing with a brush or irradiation of an ultrasonic wave. With a photosensitive transfer material having photosensitive resin layers having different colors adopted, repetition of a process including the above steps enables a multicolor image to be formed.

While an alkaline aqueous solution of the invention is a dilute aqueous solution of an alkaline material, the solution also includes, in the meaning, an alkaline aqueous solution added with a small amount of an organic solvent miscible with water. Proper examples of alkaline materials include alkali metal hydroxides (for example, sodium hydroxide and potassium hydroxide), alkali metal carbonates (for example, sodium carbonate and potassium carbonate), alkali metal bicarbonates (sodium bicarbonate and potassium bicarbonate), alkali metal silicates (sodium silicate and potassium silicate), alkali metal metasilicates (sodium metasilicate and potassium metasilicate), triethanolamine, diethanolamine, monoethanolamine, morphorine, tetralkylammonium hydroxides (for example tetramethylammonium hydroxide) and trisodium phosphate. A concentration of an alkaline material is preferably in the range of 0.01% by mass to 30% by mass and a pH value is preferably in the range of 8 to 14. Preferable examples of organic solvent miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butylolactone, dimethylformamide, dimethylacetamide, hexamethylphosphoramide, ethyl lactate, methyl lactate, ε-caprolactam and N-methylpyrrolidone. A concentration of an organic solvent miscible with water is preferably in the range of 0.1% by mass to 30% by mass. A known surfactant can be further added. A concentration of a surfactant is preferably in the range of 0.01% by mass to 10% by mass. A developing solution can be used as a bath solution or an atomized solution. Removal of an uncured portion of a photopolymerizable light-intercepting layer can be achieved by combination with a method of rubbing the portion with a rotating brush in a developing solution or with a wet sponge holding a developing solution therein. A temperature of a developing solution is preferably applied in the range of room temperature to 40° C. It is also possible to add a water washing step after a developing treatment.

While development may be applied to a thermoplastic resin layer, an intermediate layer, and a photosensitive resin layer at a time, a two step treatment may be adopted, in which the thermoplastic resin layer and the intermediate layer are dissolved and removed, and thereafter the photosensitive resin layer is developed in order to reduce developing unevenness and to minimize a loss of an effect of a developing solution prior to development of a photosensitive resin layer. A developing solution dissolving the thermoplastic resin layer and the intermediate layer is a solvent or an aqueous developing solution. The developing solution preferably has less influence on the photosensitive resin layer during the removal of the thermoplastic resin layer and the intermediate layer. Influence on the photosensitive resin layer can be reduced by selecting a developing solution that has a difference between the dissolving speed of the thermoplastic resin layer and the intermediate layer and the dissolving speed of the photosensitive resin layer. Alternatively, influence on the photosensitive resin layer can be reduced by properly combining developing treatment conditions such as a solution temperature, a spray pressure, a rubbing force and the like. Only the thermoplastic resin layer and the intermediate layer can be removed without developing the photosensitive resin layer by selecting a proper developing solution for a thermoplastic resin layer and an intermediate layer. For example, one can select a developing solution where the minimum time required for developing a photosensitive resin layer is equal to two or more times as long as a minimum time required for development of the thermoplastic resin layer and the intermediate layer. Thereafter, the photosensitive resin layer is developed by using a developing solution dedicated to the photosensitive resin layer, and the effect of the developing solution is not reduced in the removal of the thermoplastic resin layer and the intermediate layer. Moreover, by removing the thermoplastic resin layer and the intermediate layer in advance, an image uniform in a developed state is obtained without suffering developing unevenness caused by the removal irregularities of the thermoplastic resin layer within the substrate, as compared with a case where the three layers are simultaneously dissolved or developed in one step by the same developing solution. A thermoplastic resin layer and an intermediate layer may be peeled off and removed with water or a developing solution described above. A method of peeling-off and removal can be carried out in combining use of a bath solution or a sprayed solution and rubbing in a developing solution using a rotating brush or rubbing with a wet sponge holding a developing solution therein.

A photosensitive transfer material of the invention is mainly applied conveniently to preparation of a printed circuit board, formation of a multicolor image, particularly preparation of color filters such as a color filter for a liquid crystal display and formation of a protective layer of a color filter. In preparation of a printed circuit board, a known copper clad laminate is used as a substrate. In preparation of a color filter, substrates therefor include a known glass plate, a soda glass plate on a surface of which a silicon oxide film is formed, and the like.

EXAMPLES

The present invention will be explained in more detail by using examples, but it should be noted that the invention is not limited to the examples.

Example 1

A coating solution prepared according to the following formula Cu1 was coated on a temporary support of a polyethyleneterephthalate film having a thickness of 75 $\mu$m and dried to thereby provide a thermoplastic resin layer of a dry film thickness of 16 $\mu$m.

| Formula Cu1 for Thermoplastic Resin Layer: | |
|---|---|
| Polyester resin (Byron 220 manufactured by Toyobo Co., Ltd. with a number average molecular weight of 3000) | 11.7 parts by mass |
| Thermoplastic resin (A) Methylmethacrylate/2-ethylhexylacrylate/benzylmethacrylate/methacrylic acid copolymer (copolymer compositional ratio (in molar ratio) = 55/30/10/5 with a weight average molecular weight = 100000 and Tg ≈ 70° C.) | 8.2 parts by mass |
| Thermoplastic resin (B) Styrene/acrylic acid copolymer (copolymer compositional ratio (in molar ratio) = 65/35 with a weight average molecular weight = 10000 and Tg ≈ 100° C.) | 19.1 parts by mass |
| Compound obtained by dehydration condensation of 2 equivalents of pentaethylene glycol monomethacrylate with bisphenol A (BPE-500 manufactured by Shin-Nakamura Chemical Co., Ltd.) | 9 parts by mass |
| Toluene | 10 parts by mass |
| Methyl ethyl ketone | 107 parts by mass |

| Formula Cu1 for Thermoplastic Resin Layer: | |
|---|---|
| Methanol | 25 parts by mass |
| Fluorine containing polymer* (30% by mass methyl isobutyl ketone solution) | 0.55 parts by mass |

Fluorine containing polymer* is a copolymer of 40 parts by mass of $C_6F_{13}CH_2CH_2OCOCH=CH_2$, 55 parts by mass of $H(O(CH_3)CHCH_2)_7OCOCH=CH_2$ and 5 parts by mass of $H(OCHCH_2)_7OCOCH=CH_2$ with a weight average molecular weight of 30000.

A coating solution of the following formula P1 was then coated on the above thermoplastic resin layer and dried to prepare a temporary support provided with an intermediate layer made of a dry film having a thickness of 1.6 $\mu$m thereon. The temporary support here, dissimilar to the above described temporary support, means a temporary support having a thermoplastic resin layer and an intermediate layer thereon.

| Formula P1 for Intermediate Layer | |
|---|---|
| PVA205 (polyvinyl alcohol manufactured by Kuraray Co., Ltd. with saponification degree = 88% and a polymerization degree = 550) | 100 parts by mass |
| Polyvinylpyrrolidone (PVP, K-30 manufactured by GAF Corporation) | 50 parts by mass |
| Distilled water | 1850 parts by mass |
| Methanol | 1000 parts by mass |

The following coating solutions with respective formulae in 4 colors shown in Table 1 were coated on the 4 temporary supports each having a thermoplastic resin layer and an intermediate layer described above: for a K layer in black, for a R layer in red, for a G layer in green and for a B layer in Blue to dry the wet coats to form colored photosensitive resin layers with a dry film thickness of 2 $\mu$m.

TABLE 1

| | Red (g) | Green (g) | Blue (g) | Black (g) |
|---|---|---|---|---|
| Benzylmethacrylate/methacrylic acid copolymer (molar ratio = 72/78 with a molecular weight = 30000) | 30.0 | 33.5 | 34.1 | 40.6 |
| Dipentaerythritolhexaacrylate | 28.4 | 25.2 | 32.3 | 30.5 |
| F177P (fluorine containing surfactant manufactured by Dainippon Ink and Chemicals, Inc.) | 0.37 | 0.19 | 0.19 | 0.30 |
| 2,4-bis(trichloromethyl)-6-[4-(N,N-diethoxycarbonylmethyl)-3-bromophenyl]-S-triazine | 1.31 | 0 | 1.52 | 1.47 |
| 2-trichloromethyl-5-(P-styrylstyryl)-1,3,4-oxadiazole | 0 | 1.2 | 0 | 0 |
| Phenothiazine | 0.022 | 0.020 | 0.026 | 0.015 |
| Chromophthal red A2B | 27 | 0 | 0 | 0 |
| C. I. PY138 | 10.3 | 23.0 | 0 | 0 |
| Monastral Green 6Y | 0 | 23.0 | 0 | 0 |
| Heliogen Blue L6700F | 0 | 0 | 25.6 | 0 |
| Lyonogen Violet RL | 0 | 0 | 0.8 | 0 |
| Carbon black (in black) | — | — | — | 27.1 |
| Methoxypropylene glycol acetate | 310 | 310 | 310 | 310 |
| Methyl ethyl ketone | 460 | 460 | 460 | 460 |

A cover sheet of polypropylene having a thickness of 12 $\mu$m was press adhered onto each photosensitive resin layer to prepare photosensitive transfer materials in red, blue, green and black.

A color filter was prepared according to the following method using the photosensitive transfer materials. The cover sheet on the red photosensitive transfer material was peeled off, a surface of the photosensitive resin layer was adhered onto a transparent substrate having a thickness of 1.1 mm using a laminator (manufactured by Taisei Laminator Co., Ltd. with a trade name of VP-11) under pressure of 10 kg/cm and heating at 130° C. at laminating speed of 0.7 m/min. Subsequently, the temporary support was removed by peeling it at the interface between the intermediate layer and the thermoplastic resin layer. Then, light was exposed through a predetermined photomask and the photosensitive resin layer was developed with a 1% sodium carbonate aqueous solution to thereby remove an unnecessary portion and to form a red pixel pattern on the glass substrate.

Then, the green photosensitive transfer material was adhered onto the glass substrate having the red pixel pattern formed thereon in the same manner to the above case, followed by peeling-off, exposure and development, to form a green pixel pattern. A similar process was repeated with the blue and black photosensitive transfer materials to eventually form a color filter on the transparent glass substrate. In each of the processes, transferability and dissolving property of a material deriving from a thermoplastic resin layer into a developing solution were not problematic and they were levels of practical use.

[Evaluation on Dissolving Property of a Material Deriving from Thermoplastic Resin Layer into Developing Solution]

A photosensitive resin layer was developed with a 1% sodium carbonate aqueous solution and observation was performed on the dissolving property of a material deriving from the thermoplastic resin layer and evaluation was conducted according to five ratings of AA, BB, CC, DD and EE. The ratings of CC or higher are levels of practical use.

AA: Dissolved in 10 sec or less and very good dissolving property.

BB: Dissolved in 20 sec or less and good dissolving property.

CC: Dissolved in 30 sec or less and average dissolving property.

DD: Dissolved in 50 sec or less and poor dissolving property.

EE: Not dissolved and extremely poor dissolving property.

[Evaluation on Transferability]

Transferability was evaluated by observing bubbles trapped in the photosensitive transfer material during adhesion thereof with the above laminator using a microscope according to five ratings of AA, BB, CC, DD and EE. The ratings of CC or higher are levels of practical use.

AA: No bubbles trapped and very good transferability.

BB: A very small number of bubbles are trapped in the 4 corners of a substrate which are non-display portions, no bubbles are trapped in other portions, and good transferability.

CC: Though a small number of bubbles are trapped in the 4 corners of a substrate which are non-display portions, no bubbles are trapped in other portions, and average transferability.

DD: A small number of bubbles are trapped in a display portion and poor transferability.

EE: Bubbles are trapped all over the surface and extremely poor transferability.

Examples 2 and 3

Photosensitive transfer materials were prepared in the same manner as in Example 1 except that, as shown in Table 2, the content of a polyester resin in Cu1 was changed from 30% by weight in Example 1 to 60% by weight and 90% by weight while the concentration of a non-volatile matter and the ratio of thermoplastic resin (A)/thermoplastic resin (B) in Cu1 were maintained the same. Here, the percentage of a polyester resin is based on a total solid content of the thermoplastic resin layer.

Examples 4 to 6

Photosensitive transfer materials were prepared in the same manner as in Example 1 except that a number average molecular weight of polyester resin in Cu1 was changed from 3000 in Example 1 to 1800, 14000 and 23000.

Comparative Examples 1 and 2

Photosensitive transfer materials were prepared in the same manner as in Example 1 except that, as shown in Table 2, the content of a polyester resin in Cu1 was changed from 30% by weight in Example 1 to 0% and 10% by weight while the concentration of a non-volatile matter and the ratio of thermoplastic resin (A)/thermoplastic resin (B) in Cu1 were maintained the same. As a result, a position of a peeling-off interface was altered from between the intermediate layer and the thermoplastic resin layer to between the thermoplastic resin layer and the temporary support.

Comparative Example 3

A photosensitive transfer material was prepared in the same manner as in Example 1 except that, as shown in Table 2, the content of a polyester resin in Cu1 was changed from 30% by weight in Example 1 to 100% by weight while the concentration of a non-volatile matter and the ratio of thermoplastic resin (A)/thermoplastic resin (B) in Cu1 were maintained the same. As a result, a material deriving from the thermoplastic resin layer was not dissolved, thereby disabling development.

The conditions and evaluation results of the examples and the comparative examples are shown in Table 2.

TABLE 2

| | Polyester resin | | Evaluation results | | |
| --- | --- | --- | --- | --- | --- |
| | | | Transferring properties | Developing properties of material deriving from thermoplastic resin layer | Peeling-off interfaces |
| | Molecular weight | Amount (%) | | | |
| Example 1 | 3000 | 30 | BB | BB | Intermediate layer/thermoplastic resin layer |
| Example 2 | 3000 | 60 | BB | BB | Intermediate layer/thermoplastic resin layer |

TABLE 2-continued

| | Polyester resin | | Evaluation results | | |
| | Molecular weight | Amount (%) | Transferring properties | Developing properties of material deriving from thermoplastic resin layer | Peeling-off interfaces |
|---|---|---|---|---|---|
| Example 3 | 3000 | 90 | BB | BB–CC | Intermediate layer/thermoplastic resin layer |
| Example 4 | 1800 | 30 | AA–BB | AA–BB | Intermediate layer/thermoplastic resin layer |
| Example 5 | 14000 | 30 | BB–CC | BB | Intermediate layer/thermoplastic resin layer |
| Example 6 | 23000 | 30 | BB–CC | BB–CC | Intermediate layer/thermoplastic resin layer |
| Comparative example 1 | — | 0 | AA | AA | Temporary support/thermoplastic resin layer |
| Comparative example 2 | 3000 | 10 | DD | AA–BB | Temporary support/thermoplastic resin layer |
| Comparative example 3 | 3000 | 100 | BB | EE | Intermediate layer/thermoplastic resin layer |

As shown in Table 2, in some cases of the examples a small number of bubbles were observed in the 4 corners of the substrate or along the 4 sides thereof, which were non-display portions, but transferring properties were excellent particularly in Examples 1 to 4. Dissolving properties of the material deriving from the thermoplastic resin layers into developing solutions were good in Examples 1, 2, 4 and 5. It can also be seen that a peeling-off interface was between the intermediate layer and the thermoplastic resin layer in all of the examples, as intended. Among them, the conditions in Example 4 provided the best results.

On the other hand, in Comparative Example 1 in which no polyester resin was added, a position of a peeling-off interface was not between the intermediate layer and the thermoplastic layer (i.e. the desired position) but between the temporary support and the thermoplastic resin layer although a transferability and a developing property of the material deriving from the thermoplastic resin layer were good. In Comparative Example 2, in which a small amount of polyester was added, neither transferability nor a position of a peeling-off interface were obtained as intended. In Comparative Example 3, in which polyester was 100% by weight based on a total solid content of the thermoplastic resin layer, the thermoplastic resin layer did not show a good dissolving property in a developing solution.

According to the photosensitive transfer material of the invention, a thermoplastic resin layer improved in transferability is disposed between an intermediate layer (a photosensitive resin layer and an intermediate layer to which an image is transferred) and a temporary support. Thus, a high speed transfer becomes possible without causing a transfer defect (generation of bubbles) originating from scratches on a permanent support or from the surface level differences caused by pixels that have been already formed thereon, and the like. The peeling-off occurs between the intermediate layer and the thermoplastic resin layer; in other words, the thermoplastic resin layer is removed together with the temporary support. Therefore, a developing solution that would be otherwise required for dissolving the thermoplastic resin layer becomes unnecessary, having a large effect on cost.

What is claimed is:

1. A photosensitive transfer material comprising a temporary support, a thermoplastic resin layer, an intermediate layer, and a photosensitive recording layer, wherein the thermoplastic resin layer, the intermediate layer and the photosensitive recording layer are provided in this order on the temporary support and the thermoplastic resin layer includes a thermoplastic resin and a polyester resin, the polyester resin being contained in the thermoplastic resin layer in an amount of at least 20% by weight and n more than 90% by weight based on a total solid content of the thermoplastic resin layer and wherein a number average molecular weight of the polyester resin is at least 800 and no more than 50.000.

2. The photosensitive transfer material of claim 1, wherein the polyester resin is a polymer compound having an ester bond in a molecule and obtained by condensation polymerization of a dicarboxylic acid or a derivative thereof and a polyvalent alcohol.

3. The photosensitive transfer material of claim 1, wherein the polyester resin is soluble in an organic solvent.

4. The photosensitive transfer material of claim 3, wherein the polyester resin is crystalline.

5. The photosensitive transfer material of claim 2, wherein the polyvalent alcohol is one selected from the group consisting of ethylene glycol, propylene glycol and glycerin.

6. The photosensitive transfer material of claim 1, wherein the thermoplastic resin includes a resin that retains film strength and a resin that imparts a melting property when heated.

7. The photosensitive transfer material of claim 6, wherein the resin that retains film strength is a copolymer of methacrylic acid, 2-ethylhexylacrylate benzylmethacrylate and methyl-methacrylate.

8. The photosensitive transfer material of claim 6, wherein the resin that imparts a melting property when heated is a copolymer of styrene and (meth)acrylic acid.

9. The photosensitive transfer material of claim 1, wherein the thermoplastic resin layer further contains a binder in an amount of 10% to 80% by weight based on a total solid content of the thermoplastic resin layer.

10. The photosensitive transfer material of claim 1, wherein the thermoplastic resin layer has a thickness of at least about 6 $\mu$m and no mar than about 100 $\mu$m.

11. The photosensitive transfer material of claim 1, wherein the intermediate layer is made of a material that can be dispersed or dissolved in water or an alkaline aqueous solution.

12. The photosensitive transfer material of claim 1, wherein the intermediate layer has a thickness of at least about 0.1 µm and no more than about 5 µm.

13. The photosensitive transfer material of claim 1, wherein the photosensitive recording layer is thermoplastic and becomes soft adhesive at a temperature of no more than 150° C.

14. The photosensitive transfer material of claim 1, further comprising a cover sheet provided on the photosensitive resin layer.

15. A photosensitive transfer material according to claim 1, wherein a number average molecular weight of the polyester resin is from 1,500 to 35,000.

16. A photosensitive transfer material according to claim 1, wherein a number average molecular weight of the polyester resin is from 1,800 to 17,000.

17. A photosensitive transfer material according to claim 1, wherein a number average molecular weight of the polyester resin is from 1,500 to 35,000 and wherein the polyester resin is crystalline polyester.

18. A photosensitive transfer material according to claim 1, wherein the thermoplastic resin is a thermoplastic resin other than a polyester resin.

19. The photosensitive transfer material of claim 6, wherein the thermoplastic resin that retains film strength is a thermoplastic resin soluble in an alkaline solution and which weight average molecular weight is 50,000 to 500,000.

20. The photosensitive transfer material of claim 6, wherein the resin that imparts a melting property when heated is a thermoplastic resin soluble in an alkaline solution and which weight average molecular weight is 3,000 to 30,000.

* * * * *